(12) United States Patent
Ahn et al.

(10) Patent No.: US 8,343,796 B2
(45) Date of Patent: Jan. 1, 2013

(54) METHOD OF FABRICATING THIN FILM TRANSISTOR BY CRYSTALLIZATION THROUGH METAL LAYER FORMING SOURCE AND DRAIN ELECTRODES

(75) Inventors: Ji-Su Ahn, Yongin (KR); Sung-Chul Kim, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 13/206,227

(22) Filed: Aug. 9, 2011

(65) Prior Publication Data

US 2011/0294267 A1 Dec. 1, 2011

Related U.S. Application Data

(62) Division of application No. 12/458,142, filed on Jul. 1, 2009, now abandoned.

(30) Foreign Application Priority Data

Jul. 2, 2008 (KR) ........................ 10-2008-0064001

(51) Int. Cl.
*H01L 21/00* (2006.01)

(52) U.S. Cl. .............. 438/82; 438/48; 438/99; 438/149; 438/479; 257/40; 257/59; 257/72; 257/347

(58) Field of Classification Search .................... 438/48, 438/82, 99, 128, 149, 479, 517; 257/40, 257/59, 72, 347
See application file for complete search history.

(56) References Cited

U.S. PATENT DOCUMENTS

| | | | |
|---|---|---|---|
| 6,426,246 B1 | 7/2002 | Chang et al. | |
| 6,482,721 B1 | 11/2002 | Lee | |
| 6,784,034 B1 | 8/2004 | Choi | |
| 6,984,550 B2 * | 1/2006 | Yamazaki et al. | 438/155 |
| 7,015,501 B2 | 3/2006 | Redecker et al. | |
| 2005/0104068 A1 | 5/2005 | Yamazaki | |

FOREIGN PATENT DOCUMENTS

| | | |
|---|---|---|
| KR | 10-2000-0018565 A | 4/2000 |
| KR | 10-2000-0031709 A | 6/2000 |
| KR | 10-2000-0065442 A | 11/2000 |
| KR | 10-2005-0058677 A | 6/2005 |
| KR | 10-2005-0120368 A | 12/2005 |
| KR | 10-2006-0040367 A | 5/2006 |
| KR | 10-2006-0055621 A | 5/2006 |

* cited by examiner

*Primary Examiner* — Ori Nadav
(74) *Attorney, Agent, or Firm* — Lee & Morse, P.C.

(57) ABSTRACT

A method of fabricating a thin film transistor includes patterning the amorphous semiconductor layer to form an amorphous semiconductor layer pattern, forming a gate electrode corresponding to the amorphous semiconductor layer pattern on a gate insulating layer, forming an interlayer insulating layer on the entire surface of the substrate, forming a first contact hole partially exposing the amorphous semiconductor layer pattern, forming a second contact hole partially exposing the gate electrode, and forming a metal layer on the entire surface of the substrate. The method also includes applying an electrical field to the metal layer such that a semiconductor layer is formed by crystallization of the amorphous semiconductor layer pattern, and patterning the metal layer to form source and drain electrodes that are insulated from the gate electrode and that are electrically connected with the semiconductor layer through the first contact hole.

14 Claims, 4 Drawing Sheets

METHOD OF FABRICATING THIN FILM TRANSISTOR BY CRYSTALLIZATION THROUGH METAL LAYER FORMING SOURCE AND DRAIN ELECTRODES

CROSS REFERENCE TO RELATED APPLICATION

This is a divisional application based on application Ser. No. 12/458,142, filed Jul. 1, 2009 now abandoned, the entire contents of which is hereby incorporated by reference.

BACKGROUND OF THE INVENTION

1. Field of the Invention

Embodiments of the present invention relate to a thin film transistor, a method of fabricating the same, and an organic light emitting diode display device including the same. More particularly, embodiments of the present invention relate to a thin film transistor (TFT) that can prevent generated Joule heat from generating an arc during a conventional crystallization process.

2. Description of the Related Art

Annealing methods used during a crystallization process generally include a furnace annealing method using a heat furnace, a rapid thermal annealing (RTA) method using radiant heat, e.g., a halogen lamp, a laser annealing method using a laser, and an annealing method using Joule heating. Among available annealing methods, an appropriate annealing method for the crystallization process is determined based on characteristics of material and process contemplated. Some of the factors to be considered in the selection of an appropriate annealing method are a range of an annealing temperature, uniformity of the annealing temperature, a heating rate, a cooling rate, purchase price, and maintenance cost. However, a selection of annealing method becomes very limited when high temperature annealing or high rate annealing only in a local region of a material is needed.

The laser annealing method can rapidly anneal a surface of a material. Despite this advantage, the laser annealing method has only limited applicability, since it can only be used to anneal particular materials. When scanned linear laser beams overlap to anneal a large-sized device, non-uniformity in intensity of the laser beam and in irradiation level of the laser beam may occur. Also, the laser annealing method requires very expensive equipment, as well as incurring high maintenance cost.

The RTA method is widely applied to a semiconductor fabrication process. However, with current technology, RTA methods can be applied only to a 300 mm silicon wafer, so it is difficult to uniformly anneal a substrate larger than 300 mm. Moreover, this method has a maximum heating rate of about 400° C./sec, and thus cannot be applied to a process requiring a higher heating rate than 400° C./sec.

Thus, research has been widely conducted on annealing methods to solve these problems and to eliminate processing limitations. A rapid annealing method, which applies an electrical field to a conductive layer and generates Joule heat, can rapidly anneal a selected material by transferring high heat. The rapid annealing method has much higher heating rate than that of the conventional RTA method. However, such a rapid annealing method cannot prevent physical defects of substrates from an arc generated during the Joule heating.

SUMMARY OF THE INVENTION

Embodiments of the present invention are therefore directed to a TFT, a method of fabricating the same, and an organic light emitting diode (OLED) display device using the same, which substantially overcome one or more of the disadvantages of the related art.

It is therefore a feature of an embodiment of the present invention to provide a TFT having a semiconductor layer crystallized by application of an electric field using a metal layer capable of preventing an arc formation during the crystallization of an amorphous layer, as the result of heat transfer from the metal layer.

It is therefore another feature of an embodiment of the present invention to provide a method of fabricating a TFT exhibiting above features and OLED display device including the TFT.

At least one of the above features and other advantages of the present invention may be realized by providing a TFT, including a substrate, a buffer layer on the substrate, a semiconductor layer on the buffer layer, a gate insulating layer on the semiconductor layer, a gate electrode on the gate insulating layer, an interlayer insulating layer on the entire surface of the substrate having the gate electrode, and having a first contact hole and a second contact hole, and source and drain electrodes on the interlayer insulating layer, insulated from the gate electrode, and having a portion connected with the semiconductor layer through the first contact hole.

It is therefore another feature of an embodiment of the present invention to provide the TFT including a metal layer forming source and drain electrodes further includes a metal layer pattern that disposes on the gate electrode.

It is therefore another feature of an embodiment of the present invention to provide the TFT having the first and the second contact holes in where the first contact hole is spaced apart from the second hole. The first contact hole partially exposes the semiconductor layer. The second contact hole partially exposes the gate electrode and is disposed in a region corresponding to a channel region of the semiconductor layer.

At least one of the above features and other advantages of the present invention may be realized by providing a method of fabricating the TFT including preparing a substrate, forming a buffer layer on the substrate, forming an amorphous semiconductor layer on the buffer layer, patterning the amorphous semiconductor layer to form a semiconductor layer pattern, forming a gate insulating layer on the semiconductor layer pattern, forming a gate electrode corresponding to the semiconductor layer pattern on the gate insulating layer, forming an interlayer insulating layer on the entire surface of the substrate, forming a first contact hole partially exposing the semiconductor layer, and a second contact hole partially exposing the gate electrode on the interlayer insulating layer, forming a metal layer on the entire surface of the substrate, applying an electrical field to the metal layer, and forming a semiconductor layer by crystallization of the semiconductor layer pattern and patterning the metal layer for source and drain electrodes to form source and drain electrodes insulated from the gate electrode and electrically connected with the semiconductor layer through the first contact hole.

It is therefore another feature of an embodiment of the present invention to provide the method of fabricating the TFT in where crystallization is performed while the metal layer is in contact with the gate electrode through the second contact hole.

It is therefore another feature of an embodiment of the present invention to provide the method of fabricating the TFT in where the electrical field of about 100 V/cm$^2$ to about 10,000 V/cm$^2$ is applied to the metal layer.

It is therefore another feature of an embodiment of the present invention to provide the method of fabricating the TFT in where the metal layer is formed to prevent exposure of the interlayer insulating layer. The voltage is applied to the metal layer.

It is therefore another feature of an embodiment of the present invention to provide the method of fabricating the TFT forming the first and second contact holes in where the first contact hole is formed to be spaced apart from the second contact hole. The second contact hole is formed to correspond to a channel region of the semiconductor layer.

Above feature and other advantages of the present invention may be realized by providing an OLED display device including a substrate, a buffer layer on the substrate, a semiconductor layer on the buffer layer, a gate insulating layer on the semiconductor layer, a gate electrode on the gate insulating layer; an interlayer insulating layer on the entire surface of the substrate having the gate electrode, and having a first contact hole and a second contact hole, source and drain electrodes on the interlayer insulating layer, insulated from the gate electrode, and having a portion connected with the semiconductor layer through the first contact hole, a passivation layer on the entire surface of the substrate, and a first electrode, an organic layer, and a second electrode, which are on the passivation layer and electrically connected with the source and drain electrodes.

It is therefore another feature of an embodiment of the present invention to provide the OLED display device including a metal layer forming source and drain electrodes further includes a metal layer pattern that disposes on the gate electrode.

It is therefore another feature of an embodiment of the present invention to provide the OLED display device including the first and the second contact holes in where the first contact hole is spaced apart from the second contact hole. The first contact hole partially exposes the semiconductor layer. The second contact hole partially exposes the gate electrode. In addition, the second contact hole is disposed in a region corresponding to a channel region of the semiconductor layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1A:
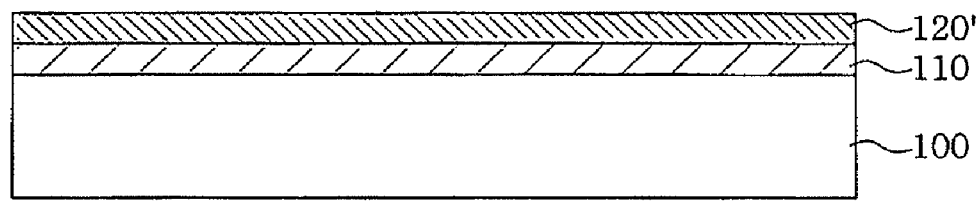
FIGS. 1A to 1D illustrate cross-sectional views of stages in a method of making a TFT according to a first exemplary embodiment of the present invention.

Korean Patent Application No. 10-2008-0064001, filed on Jul. 2, 2008, in the Korean Intellectual Property Office, and entitled: "Thin Film Transistor, Method of Fabricating the Same, and Organic Light Emitting Diode Display Device Including the Same," is incorporated by reference herein in its entirety.

Embodiments will now be described more fully hereinafter with reference to the accompanying drawings, however, may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

(Exemplary Embodiment 1)

FIGS. 1A to 1D illustrate cross-sectional views of a TFT according to a first exemplary embodiment of the present invention.

Referring to FIG. 1A, a substrate 100 is provided. The substrate 100 may be formed of glass or plastic. A buffer layer 110 may be on the substrate 100. The buffer layer 110 may prevent or reduce out-diffusion of moisture or impurities from the substrate 100 and/or may control a heat transfer rate during crystallization to facilitate the crystallization of an amorphous silicon layer. The buffer layer 110 may be, e.g., a silicon oxide layer, a silicon nitride layer, or a combination thereof.

Subsequently, an amorphous semiconductor layer 120', e.g., amorphous silicon, is formed on the substrate 100 and then patterned, thereby forming a semiconductor layer pattern 120a (shown in FIG. 1B) to be used as a semiconductor layer 120 (shown in FIG. 1C).

Figure 1B:
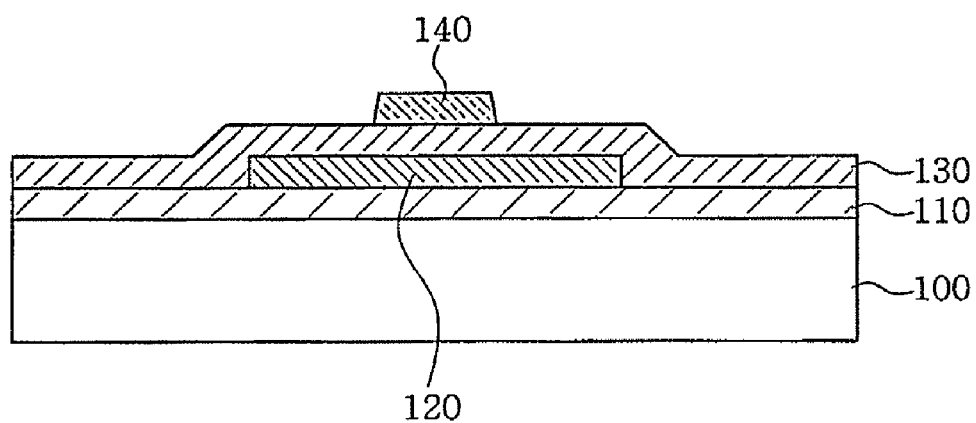

Then, referring to FIG. 1B, a gate insulating layer 130 may be provided on the entire surface of the substrate 100 including the semiconductor layer pattern 120a. The gate insulating layer 130 may be a silicon oxide layer, a silicon nitride layer, or a combination thereof.

A gate electrode 140 may be formed on the gate insulating layer 130 to correspond to the semiconductor layer pattern 120a. The gate electrode 140 may be formed of a single layer, e.g., aluminum (Al), an Al alloy such as aluminum-neodymium (Al—Nd), etc., or a multi layer formed by stacking, e.g., an aluminum (Al) alloy on chromium (Cr) or molybdenum (Mo) alloy.

Figure 1C:
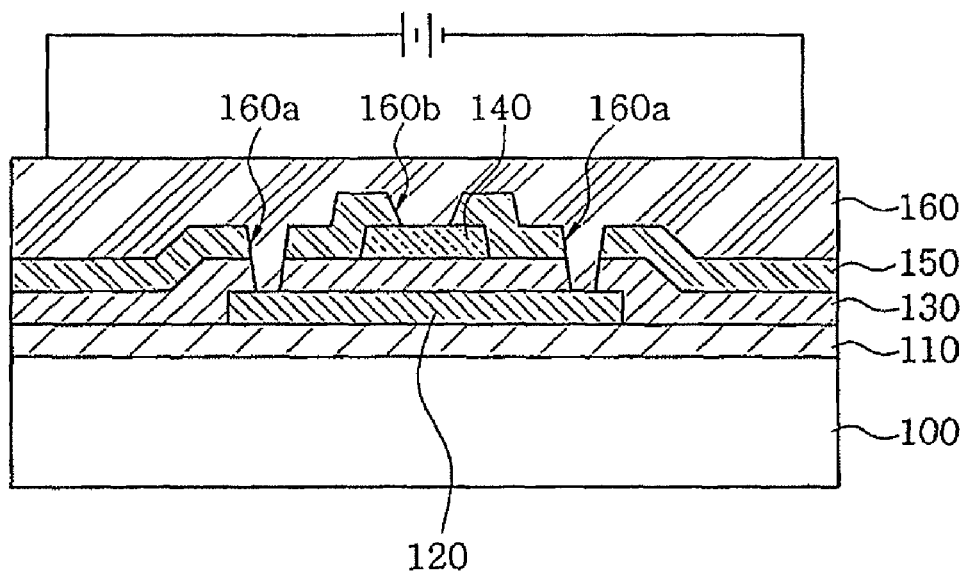

Referring to FIG. 1C, an interlayer insulating layer 150 may be formed on the entire surface of the substrate. The interlayer insulating layer 150 may be a silicon oxide layer, a silicon nitride layer, or a combination thereof.

After forming the interlayer insulating layer 150, first and second contact holes 160a and 160b may be formed. The first contact hole 160a may be formed by partially etching the gate insulating layer 130 and the interlayer insulating layer 150 to partially expose the semiconductor layer pattern 120a. The second contact hole 160b may be formed by partially etching the interlayer insulating layer 150 on the gate electrode 140 to partially expose the gate electrode.

A metal layer 160 may be formed on the entire surface of the substrate 100. When the metal layer 160 is heated by application of an electrical field, heat generated from the metal layer 160 is transferred to the underlying semiconductor layer pattern 120a, which is then crystallized into the semiconductor layer 120, e.g., polycrystalline silicon.

The metal layer 160 is connected to the semiconductor layer 120 through the first contact hole 160a, preventing formation of an arc during the crystallization and reducing defects thereof. Also, the metal layer 160 may be connected to the gate electrode 140 through the second contact hole 160*b*, transferring heat generated from the metal layer 160 to the underlying semiconductor layer 120 through the gate electrode 140, facilitating crystallization.

Here, for preferable crystallization, an electrical field of about 100 V per unit area (cm$^2$) to about 10,000 V per unit area (cm$^2$) may be applied for about 1 μs to about 1 sec. An electrical field of less than about 100 V per unit area (cm$^2$) cannot generate sufficient Joule heat for crystallization, while an electrical field of more than 10,000 V per unit area (cm$^2$) can generate a local arc. Further, when an electrical field is applied for less than 1 μs, crystallization may not be facilitated due to insufficient Joule heat, while when an electrical field is applied for more than 1 sec, the substrate may be bent or may form a defect along an edge due to heat transfer during crystallization.

Figure 1D:
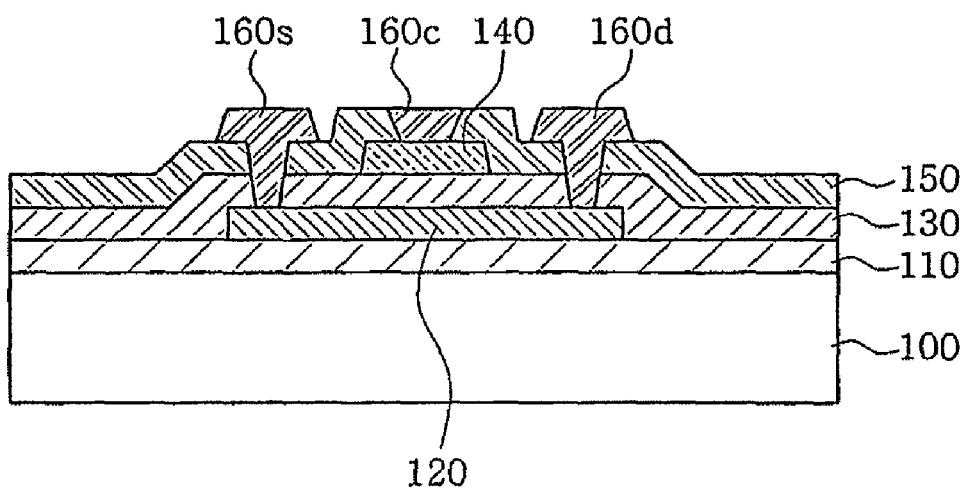

Referring to FIG. 1D, after the semiconductor layer 120 is formed, the metal layer 160 may be patterned to form source and drain electrodes 160*s* and 160*d*. Here, a metal layer pattern 160*c* may remain in the second contact hole 160*b* on the gate electrode 140. Accordingly, the TFT according to an Exemplary embodiment 1 is completed.

The metal layer 160 is generally formed to a thickness suitable for the source and drain electrodes 160*s* and 160*d*, e.g., about 50 nm to about 200 nm. When the thickness of the metal layer 160 is less than about 50 nm, the metal layer 160 on the gate electrode 140 may not be uniform, so that heat cannot be uniformly transferred to the amorphous silicon layer, resulting in non-uniform crystallization. When the thickness of the metal layer 160 is greater than about 200 nm, the gate electrode 140 may no longer be suitable for thin film device. Thus, when the metal layer 160 has a thickness of about 200 nm or less, but exceeding 50 nm, uniform crystallization may be realized, while allowing the gate electrode to properly operate as an electrode suitable for the thin film device.

The metal layer 160 may be formed of one or more of molybdenum (Mo), chromium (Cr), tungsten (W), MoW, aluminum (Al), Al—Nd, titanium (Ti), titanium nitride (TiN), copper (Cu), a Mo alloy, an Al alloy and a Cu alloy.

(Exemplary Embodiment 2)

Exemplary embodiment 2 is almost same as Exemplary embodiment 1 except for formation of a second contact hole. Thus, descriptions thereof may not be repeated.

Figure 2A:
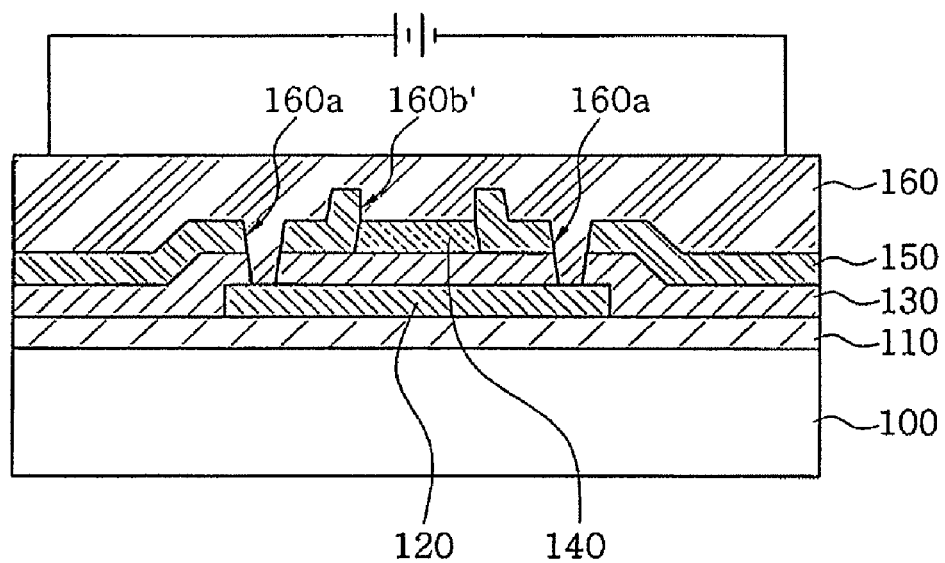
FIGS. 2A and 2B illustrate cross-sectional views of stages in a method of making a TFT according to a second exemplary embodiment of the present invention.

Referring to FIG. 2A, by the same method described with references to FIGS. 1A and 1B in Exemplary embodiment 1, the substrate 100, the buffer layer 110, the semiconductor layer pattern 120*a*, e.g., amorphous silicon pattern, the gate insulating layer 130, and the gate electrode 140 are formed. Then, an interlayer insulating layer 150 may be formed on the entire surface of the substrate 100.

Next, the first contact hole 160*a* and a second contact hole 160*b'* may be formed by etching. The gate insulating layer 130 and the interlayer insulating layer 150 may be partially etched, thereby forming the first contact hole 160*a* and partially exposing the semiconductor layer pattern 120*a* through the first contact hole 160*a*. The second contact hole 160*b'* may be formed by partially etching the interlayer insulating layer 150, which further results in partially exposing the gate electrode 140.

A region of the gate electrode 140 exposed through the second contact hole 160*b'* corresponds to a channel region 120*c* of the semiconductor layer 120 (shown in FIG. 2B) to be formed later. When the second contact hole 160*b'* is formed as described above, a contact area between the metal layer 160 and the gate electrode 140 is formed above the channel region 120*c* of the semiconductor layer 120 (shown in FIG. 2B). Such placement of the contact area results in effective heat transfer to the channel region, and crystallization of the channel region.

After the metal layer 160 is formed on the entire surface of the substrate 100, the semiconductor layer pattern 120*a* is crystallized into the semiconductor layer 120 by the same method as described in Exemplary embodiment 1.

Figure 2B:
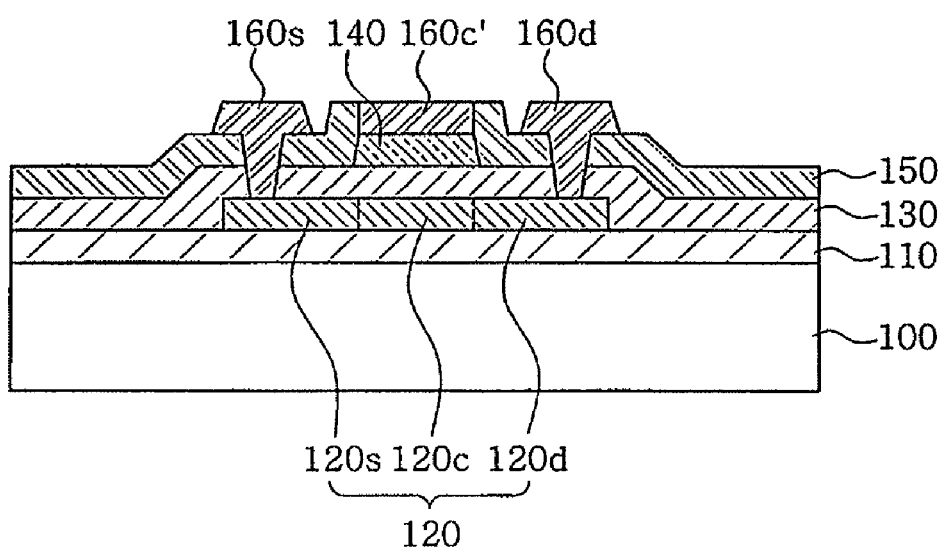

Referring to FIG. 2B, the metal layer 160 is patterned by the same method as described in Exemplary embodiment 1, thereby forming source and drain electrodes 160*s* and 160*d*. Here, a metal layer pattern 160*c'* may remain on the gate electrode 140 in the second contact hole 160*b'*. Accordingly, the TFT according to Exemplary embodiment 2 is completed.

Figure 3:
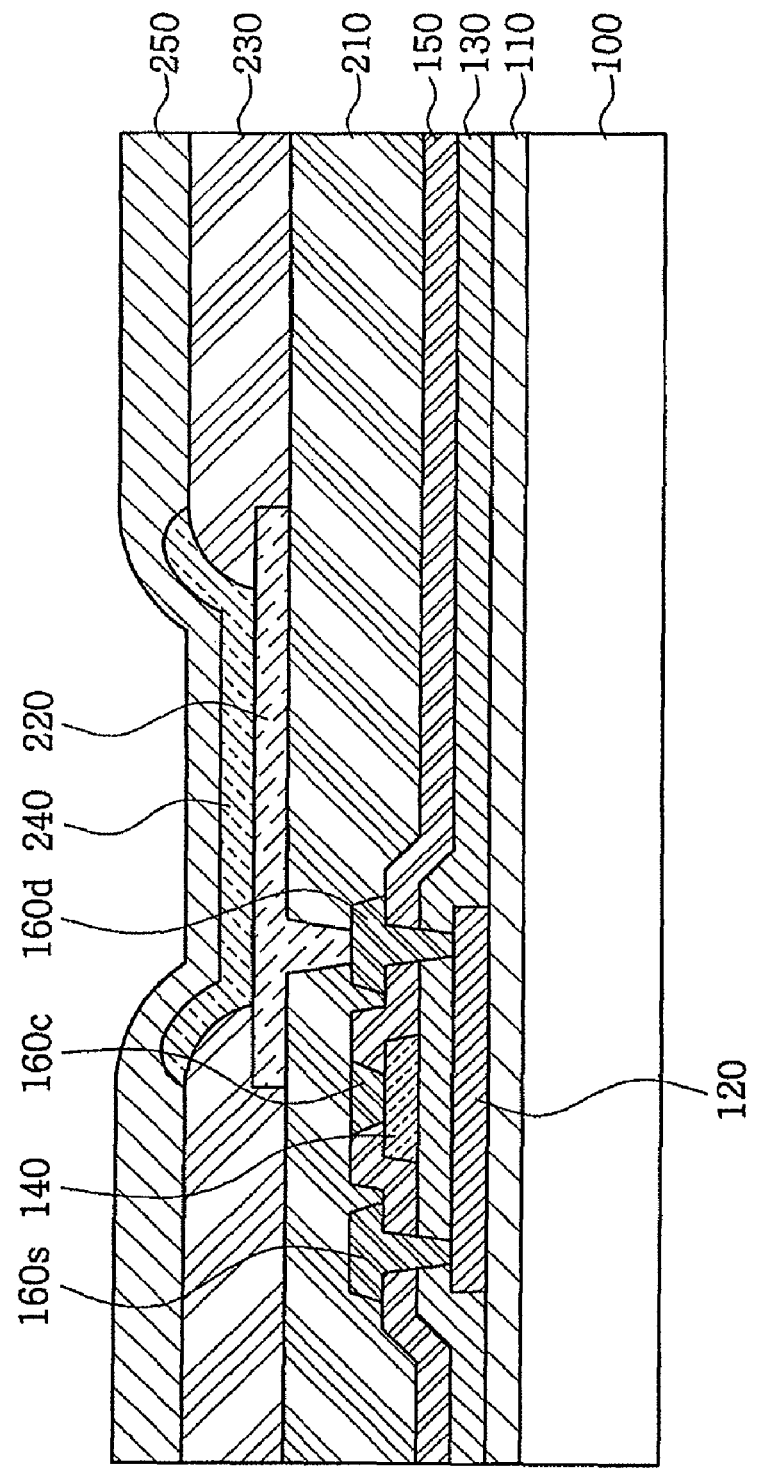
FIG. 3 illustrates a cross-sectional view of an OLED display device according to an embodiment of the present invention.

FIG. 3 illustrates a cross-sectional view of an OLED display device having a TFT according to an embodiment. The TFT is the same as that described in Exemplary embodiment 1.

Referring to FIG. 3, a passivation layer 210 may be formed on the entire surface of the substrate 100 including the TFT according to the exemplary embodiment described in FIG. 1D. The passivation layer 210 may be formed of an inorganic material, e.g., silicon oxide, silicon nitride, and silicate on glass, an organic material, e.g., polyimide, benzocyclobutene series resin and acrylate, or a combination thereof.

The passivation layer 210 may be etched to form a via hole exposing the source electrode 160*s* or drain electrode 160*d*. A first electrode 220 connected to one of the source and drain electrodes 160*s* and 160*d* through the via hole may be formed. The first electrode 220 may be an anode or a cathode. When the first electrode 220 is an anode, it may be formed of a transparent conductive layer, e.g., an ITO, IZO, or ITZO layer. When the first electrode 220 is a cathode, it may be formed of magnesium (Mg), calcium (Ca), aluminum (Al), silver (Ag), barium (Ba), or an alloy thereof.

Next, a pixel defining layer 230 may be formed on the passivation layer 210 and on the first electrode 220. The pixel defining layer may include an opening partially exposing surface of the first electrode 220 and an organic layer 240 including an emission layer, formed on the exposed portion of the first electrode 220. The organic layer 240 may further include at least one or more of a hole injection layer, a hole transport layer, a hole blocking layer, an electron blocking layer, an electrode injection layer, and an electron transport layer. As would be understood by a person of ordinary skill in the art, the organic layer 240 is a conductive layer. Then, a second electrode 250 may be formed on the pixel defining layer 230 and on the organic layer 240. Accordingly, the OLED display device according to an exemplary embodiment is completed.

By forming the electrode on the amorphous semiconductor before crystallization, an occurrence of an arc caused by Joule heat during the crystallization may be prevented. Thus, defects can be reduced, and production yield can be improved.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is clamed is:

1. A method of fabricating a thin film transistor, comprising:
   preparing a substrate;
   forming a buffer layer on the substrate;
   forming an amorphous semiconductor layer on the buffer layer;
   patterning the amorphous semiconductor layer to form an amorphous semiconductor layer pattern;
   forming a gate insulating layer on the amorphous semiconductor layer pattern;
   forming a gate electrode overlapping the amorphous semiconductor layer pattern on the gate insulating layer;
   forming an interlayer insulating layer on the entire surface of the substrate;
   patterning the interlayer insulating layer to form first contact holes partially exposing the amorphous semiconductor layer pattern and a second contact hole at least partially exposing the gate electrode on the gate insulating layer;
   forming a metal layer on the entire surface of the substrate, the metal layer filling the first contact holes and the second contact hole;
   applying an electrical field to the metal layer such that a semiconductor layer is formed by crystallization of the amorphous semiconductor layer pattern; and
   after applying the electrical field to the metal layer, patterning the metal layer such that first portions of the metal layer remain in the first contact holes and a second portion remains in the second contact hole, top surfaces of the first portions being aligned with a top surface of the second portion, and the first portions corresponding to source and drain electrodes that are insulated from the gate electrode and that are electrically connected with the semiconductor layer through the first contact holes.

2. The method as claimed in claim 1, wherein during applying the electrical field, crystallization of the amorphous semiconductor layer pattern is performed while the metal layer is in contact with the gate electrode through the second contact hole.

3. The method as claimed in claim 1, wherein the electrical field is about 100 V/cm$^2$ to about 10,000 V/cm$^2$.

4. The method as claimed in claim 1, wherein the metal layer is formed to prevent exposure of the interlayer insulating layer, and the electrical field is applied to the metal layer.

5. The method as claimed in claim 1, wherein the first contact holes are formed to be spaced apart from the second contact hole.

6. The method as claimed in claim 1, wherein the second contact hole is formed to correspond to a channel region of the semiconductor layer.

7. The method as claimed in claim 1, wherein second portion of the metal layer is in direct contact with the gate electrode.

8. The method as claimed in claim 1, wherein the metal layer is formed on the interlayer insulating layer after patterning the interlayer insulating layer to form the first contact holes and the second contact hole.

9. The method as claimed in claim 1, wherein during applying the electrical field to the metal layer, heat is transferred from the portions of the metal layer that fill the first contact holes and the second contact hole to the amorphous semiconductor layer pattern.

10. The method as claimed in claim 1, wherein the source and drain electrodes are composed entirely of the metal layer.

11. The method as claimed in claim 8, wherein the metal layer is formed directly on the interlayer insulating layer, is formed to be in direct contact with the amorphous semiconductor layer pattern via the first contact holes, and is formed to be in direct contact with the gate electrode via the second contact hole.

12. The method as claimed in claim 11, wherein the metal layer is formed to cover the interlayer insulating layer such that the metal layer covers the interlayer insulating layer during applying of the electrical field to the metal layer.

13. The method as claimed in claim 1, wherein the patterning of the amorphous semiconductor layer and the patterning of the interlayer insulating layer are both performed before forming the metal layer on the entire surface of the substrate.

14. The method as claimed in claim 1, wherein the source and drain electrodes are composed entirely of the metal layer.

* * * * *